(12) United States Patent
Emoto et al.

(10) Patent No.: US 8,978,718 B2
(45) Date of Patent: Mar. 17, 2015

(54) PURGE DEVICE AND LOAD PORT APPARATUS INCLUDING THE SAME

(75) Inventors: Jun Emoto, Tokyo (JP); Tadamasa Iwamoto, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 415 days.

(21) Appl. No.: 13/585,357

(22) Filed: Aug. 14, 2012

(65) Prior Publication Data

US 2013/0042945 A1 Feb. 21, 2013

(30) Foreign Application Priority Data

Aug. 15, 2011 (JP) .................................. 2011-177499
Jun. 13, 2012 (JP) .................................. 2012-133871

(51) Int. Cl.
*B65B 1/04* (2006.01)
*H01L 21/677* (2006.01)
*H01L 21/67* (2006.01)

(52) U.S. Cl.
CPC .... *H01L 21/67017* (2013.01); *H01L 21/67772* (2013.01); *Y10S 414/135* (2013.01)
USPC ................... 141/98; 141/51; 141/63; 141/65; 414/217.1; 414/935; 206/710

(58) Field of Classification Search
CPC .................... H01L 21/67017; H01L 21/67772
USPC .............. 141/51, 63, 65, 98; 414/217.1, 935, 414/939; 206/710
See application file for complete search history.

(56) References Cited

U.S. PATENT DOCUMENTS

| | | | | |
|---|---|---|---|---|
| 5,363,867 A | * | 11/1994 | Kawano et al. | 134/95.2 |
| 5,879,458 A | * | 3/1999 | Roberson et al. | 118/715 |
| 6,883,539 B2 | * | 4/2005 | Inoue et al. | 137/565.23 |
| 7,523,769 B2 | * | 4/2009 | Miyajima et al. | 141/47 |
| 7,726,353 B2 | * | 6/2010 | Okabe | 141/63 |
| 7,789,609 B2 | * | 9/2010 | Okabe et al. | 414/217 |
| 7,841,371 B2 | * | 11/2010 | Okabe | 141/63 |
| 8,082,955 B2 | * | 12/2011 | Okabe | 141/51 |
| 8,302,637 B2 | * | 11/2012 | Okabe et al. | 141/98 |
| 8,485,771 B2 | * | 7/2013 | Sasaki et al. | 414/411 |
| 2006/0272169 A1 | * | 12/2006 | Miyajima | 34/211 |
| 2009/0169342 A1 | * | 7/2009 | Yoshimura et al. | 414/217 |
| 2012/0060972 A1 | | 3/2012 | Okabe | |

FOREIGN PATENT DOCUMENTS

| | | |
|---|---|---|
| JP | 2007-180517 | 7/2007 |
| WO | 2005/124853 A1 | 12/2005 |

OTHER PUBLICATIONS

U.S. Appl. No. 13/541,101, filed Jul. 3, 2012, Emoto, et al.

* cited by examiner

*Primary Examiner* — Timothy L Maust
(74) *Attorney, Agent, or Firm* — Oblon, McClelland, Maier & Neustadt, L.L.P.

(57) ABSTRACT

To generate a gas-curtain for a load-port-apparatus and to supply a purge-gas into a pod by a single gas source, provided is a gas purge device including: purge nozzles extending along an outer side of side edges of the opening portion; a curtain nozzle arranged above an upper edge of the opening portion; a gas supply pipe arranged in parallel to each purge nozzle, for supplying an inert gas to the purge nozzle and the curtain nozzle, the gas being supplied from the gas supply pipe to the purge nozzle in a direction orthogonal to an extending direction of the gas supply pipe; and a conductance adjusting unit arranged at an end portion of the gas supply pipe, for generating a pressure loss in a gas flow in a configuration in which the gas is supplied to the curtain nozzle at the end portion of the gas supply pipe.

9 Claims, 7 Drawing Sheets

PURGE DEVICE AND LOAD PORT APPARATUS INCLUDING THE SAME

BACKGROUND OF THE INVENTION

1. Field of the Invention

The present invention relates to what is called a front-opening interface mechanical standard (FIMS) system, that is, a purge device to be used in a load port apparatus, for purging an interior of a pod, and the load port apparatus including the purge device, which is used for transferring, from one semiconductor processing apparatus to another semiconductor processing apparatus, wafers held in a sealed-type transport container called the pod, or for transferring the wafers from the semiconductor processing apparatus to the pod, during a semiconductor manufacturing process and the like.

2. Description of the Related Art

In recent years, in a general semiconductor manufacturing process, cleanliness is managed throughout the entire process by maintaining a highly clean state in only the following three spaces: inner spaces of various processing apparatus; an inner space of a pod capable of containing wafers and transporting the wafers from one processing apparatus to another processing apparatus; and a mini-environment in which the wafers are exchanged between the pod and the respective processing apparatus. Such a pod includes a main-unit portion which contains wafers therein and which has a wafer-insertion-and-removal opening formed in one side surface, and a lid which makes the inside of the pod serve as a sealed space by closing the opening. Further, a structure that defines the mini-environment includes an opening portion capable of facing the above-mentioned opening of the pod and a second opening portion arranged on the semiconductor processing apparatus side so as to face the opening portion.

The load port apparatus includes a member as a partition wall provided with the opening portion, that is, a wall called a side base, a door for closing the opening portion, a door drive mechanism for controlling operation of the door, and a mount table on which the pod is to be mounted. A mount base is capable of supporting the pod in such a manner as to face the opening of the pod and the opening portion each other, and brings the lid of the pod close to or apart from the door together with the pod itself. The door is capable of holding the lid of the pod. The door drive mechanism causes the door to open and close the opening portion under a state of holding the lid, and the door is caused to retract below a space between the opening portion and the second opening portion or to enter the space. A robot is arranged in the mini-environment, and the robot is capable of entering and retracting into/from the inside of the pod through the opening portion and the opening of the pod, and transfers wafers between the inside of the pod and the semiconductor processing apparatus also through the second opening portion.

In the semiconductor manufacturing process, the wafers contained in the pod may have, for example, metal wiring formed thereon. Such metal wiring has a risk that, due to surface oxidation thereof, desired characteristics cannot be obtained when a device is completed. Therefore, oxygen concentration in the pod needs to be maintained at a low level. As a technology provided to meet such a demand, Japanese Patent Application Laid-Open No. 2007-180517 discloses a configuration for maintaining the oxygen concentration in the pod at a low level by generating, when the wafers are inserted and removed into/from the pod, a gas curtain from an inert gas in parallel to the opening of the pod so as to suppress entrance of an oxidizing gas of the mini-environment into the pod, and by supplying the inert gas directly into the pod. Further, International Publication No. WO2005/124853 discloses a configuration for reducing the oxygen concentration in the pod by generating a space containing an inert gas at high concentration in the periphery of the opening portion of the pod, and in this state, supplying the inert gas into the pod.

In the above-mentioned mini-environment, entrance of an external atmosphere including dust or the like is prevented by, for example, supplying a clean air with use of a fan provided at an upper portion of the mini-environment so as to set a pressure slightly higher than an atmospheric pressure in the periphery. Further, processed wafers may have a gas, dust, or the like adhered thereto in the processing apparatus, and it is therefore necessary to prevent diffusion of the gas from the pod containing the wafers into the mini-environment. In view of this, in order to prevent the undesired diffusion of a gas, dust, or the like, it is necessary to provide a minute pressure difference so that the pressure level is set in an ascending order of the peripheral space, the interior of the pod, and the mini-environment.

In this case, in the configuration disclosed in Japanese Patent Application Laid-Open No. 2007-180517 or International Publication No. WO2005/124853, inert gas supply lines are separately provided so as to supply the inert gas into the pod and to the nozzles used for forming a high-concentration region of the inert gas or the gas curtain of the inert gas at the opening portion of the pod. Further, those inert gas supply lines are independently constructed also of the fan provided at the upper portion of the mini-environment. Therefore, in order to generate the above-mentioned appropriate pressure difference, supply amounts of the inert gas through the respective supply lines need to be controlled in parallel to control of the fan. The balance of the supply amounts is not easily adjusted, and further, in a case where the pod is upsized along with the upsizing of the wafers, the adjustment needs to be performed with extreme caution.

SUMMARY OF THE INVENTION

The present invention has been made in view of the above-mentioned circumstances, and it is therefore an object of the present invention to provide a purge device capable of optimally supplying an inert gas without performing the above-mentioned balance adjustment, and to provide a load port apparatus using the purge device.

In order to achieve the above-mentioned object of the present invention, according to an exemplary embodiment of the present invention, there is provided a gas purge device to be used for a load port apparatus, the load port apparatus including: a side base that defines a first mini-environment; and a door capable of closing an opening portion of the side base, the door being configured to hold a lid of a sealed container for containing an object to be contained, and to open and close the lid of the sealed container so that the object to be contained is insertable and removable into/from the sealed container, the gas purge device including: a cover member arranged in the first mini-environment in surrounding the opening portion, the cover member defining a second mini-environment in the first mini-environment; a curtain nozzle arranged inside of the second mini-environment at a position above the opening portion, for supplying a purge gas into the second mini-environment; a pair of purge nozzles arranged inside of the second mini-environment at both side portions of the opening portion so as to be capable of supplying the purge gas into the sealed container via the opening portion; a gas supply pipe extending toward the curtain nozzle, for supplying the purge gas to each of the pair of purge nozzles from a different direction from the extending direction of the gas supply pipe, and for supplying the purge gas to an internal space of the curtain nozzle by being connected to the internal space of the curtain nozzle at an end portion in the extending direction of the gas supply pipe; and a conductance adjusting unit arranged at the end portion of the gas supply pipe connected to the internal space of the curtain nozzle, for adjusting conductance at the end portion at the time of supplying the purge gas to the internal space of the curtain nozzle.

Note that, in the gas purge device, it is preferred that: the cover member include a cover member opening portion that enables an operation of inserting and removing the object to be contained; the curtain nozzle supply the purge gas, with respect to the second mini-environment defined between the opening portion and the cover member, onto a plane formed by intersecting the opening portion and the cover member; and the each of the pair of purge nozzles extend along a side edge of the opening portion in parallel to the gas supply pipe.

Further, it is preferred that: the curtain nozzle include a curtain filter, and the purge gas is supplied through an intermediation of the curtain filter; and the each of the pair of purge nozzles include a purge nozzle filter, and the purge gas is supplied into the sealed container through an intermediation of the purge nozzle filter.

Alternatively, it is preferred that: the curtain nozzle include: a first curtain chamber and a second curtain chamber arranged in a purge gas supplying order, the first curtain chamber and the second curtain chamber serving as the internal space of the curtain nozzle; and a curtain chamber filter arranged between the first curtain chamber and the second curtain chamber, the curtain chamber filter being capable of generating a pressure difference between the first curtain chamber and the second curtain chamber; and the purge gas be supplied from the first curtain chamber to the second curtain chamber through an intermediation of the curtain chamber filter.

Further, it is preferred that: the each of the pair of purge nozzles include: a first purge nozzle chamber and a second purge nozzle chamber arranged in a purge gas supplying order; and a purge nozzle chamber filter arranged between the first purge nozzle chamber and the second purge nozzle chamber, the purge nozzle chamber filter being capable of generating a pressure difference between the first purge nozzle chamber and the second purge nozzle chamber; and the purge gas be supplied from the first purge nozzle chamber to the second purge nozzle chamber through an intermediation of the purge nozzle chamber filter.

Alternatively, it is preferred that: the curtain nozzle include: a first curtain chamber and a second curtain chamber arranged in a purge gas supplying order, the first curtain chamber and the second curtain chamber serving as the internal space of the curtain nozzle; and a curtain chamber filter arranged between the first curtain chamber and the second curtain chamber, the curtain chamber filter being capable of generating a pressure difference between the first curtain chamber and the second curtain chamber; the purge gas be supplied from the first curtain chamber to the second curtain chamber through an intermediation of the curtain chamber filter; the each of the pair of purge nozzles include: a first purge nozzle chamber and a second purge nozzle chamber arranged in a purge gas supplying order; and a purge nozzle chamber filter arranged between the first purge nozzle chamber and the second purge nozzle chamber, the purge nozzle chamber filter being capable of generating a pressure difference between the first purge nozzle chamber and the second purge nozzle chamber; the purge gas be supplied from the first purge nozzle chamber to the second purge nozzle chamber through an intermediation of the purge nozzle chamber filter; and at least one of a set of the curtain filter and the curtain chamber filter and a set of the purge nozzle filter and the purge nozzle chamber filter have a difference in degree of pressure loss.

Further, it is preferred that: the each of the pair of purge nozzles include a purge nozzle chamber capable of generating a pressure difference between the purge nozzle chamber and the second mini-environment through an intermediation of a purge nozzle filter; and the purge gas be supplied from the gas supply pipe to the purge nozzle chamber via communication passages arranged at least at two positions on an upstream side and a downstream side in a case of supplying the purge gas to the gas supply pipe. In addition, it is preferred that: the each of the pair of purge nozzles include a flow control portion that defines a discharge direction of the purge gas at the time of discharging the purge gas.

Further, it is preferred that a load port apparatus according to another embodiment of the present invention include: a side base that defines a mini-environment; a door capable of closing an opening portion of the side base, the door being configured to hold a lid of a sealed container for containing an object to be contained, and to open and close the lid of the sealed container so that the object to be contained is insertable and removable into/from the sealed container; a door drive mechanism for supporting the side base, and the door, and for causing the door to open and close the opening portion; a mount base arranged on an outer side of the opening portion, on which the sealed container is mountable, the mount base being configured to align the sealed container and the opening portion with each other; and the gas purge device according to any one of the above-mentioned configurations.

According to the present invention, the inert gas is supplied through the single inert gas supply line for purging the interior of the pod and for generating a high-concentration region of the inert gas at the front of the opening of the pod. Further, a more appropriate supply ratio is set as compared to the conventional case. Thus, unlike the conventional case, the balance adjustment of the supply amounts of the inert gas becomes unnecessary, and the inert gas can be supplied easily and simply in an appropriate manner.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
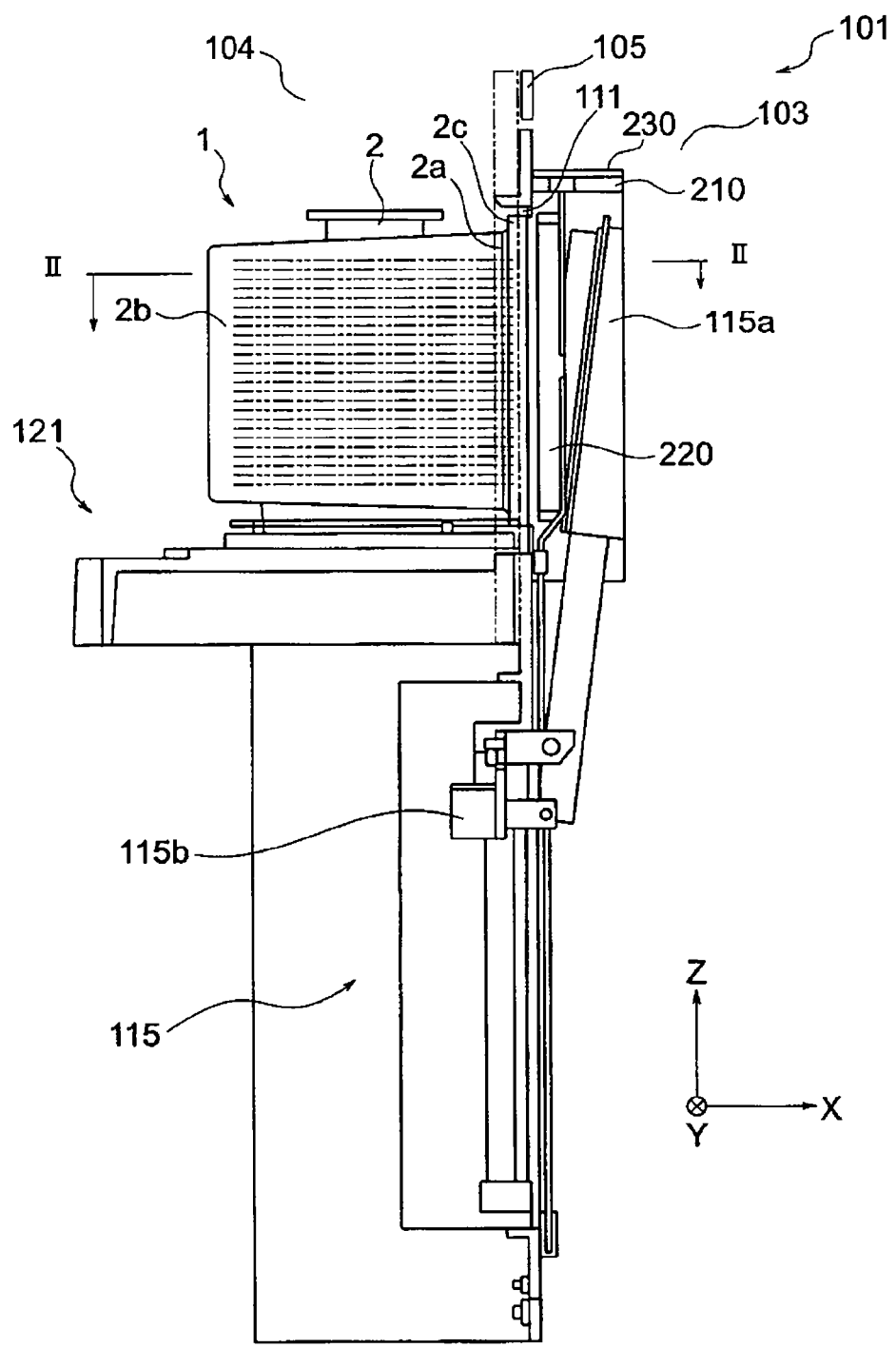
FIG. 1 is a side view for illustrating a schematic configuration of a gas purge device and a load port apparatus having the gas purge device installed thereto, according to an embodiment of the present invention, in which a pod is mounted to the load port apparatus.
Figure 2:
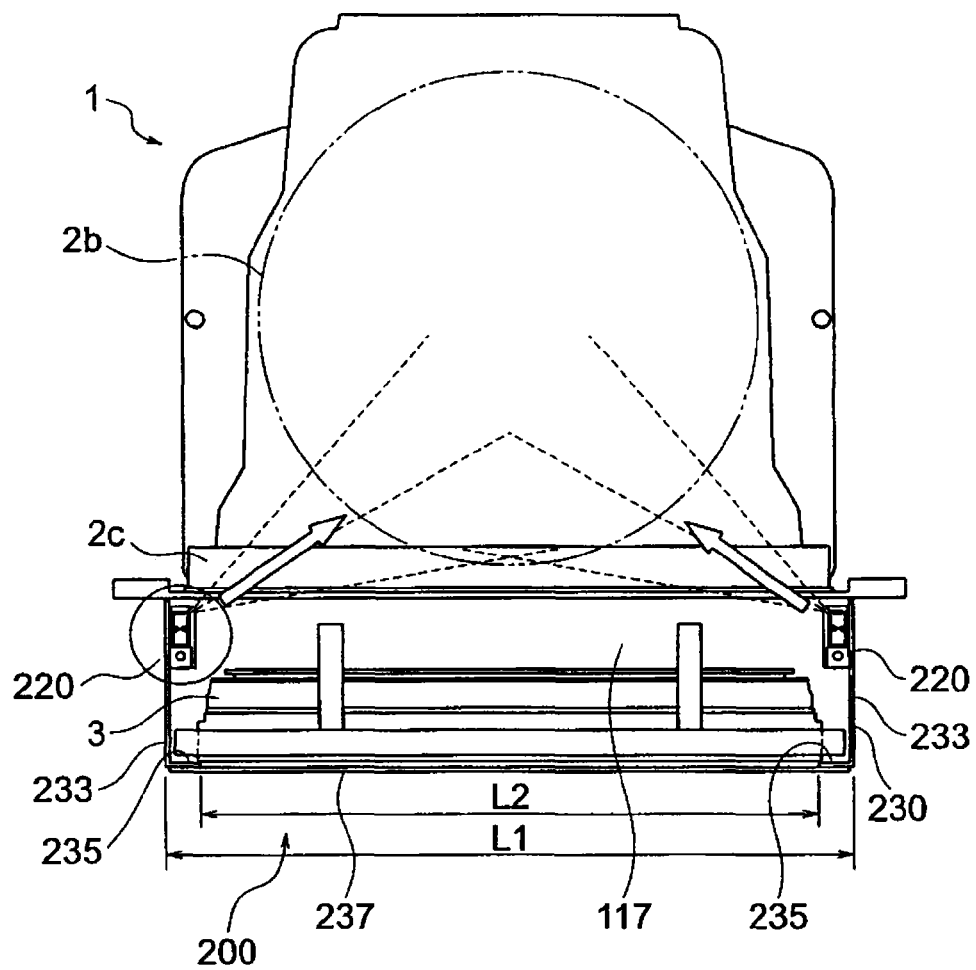
FIG. 2 is a top view taken along the line II-II of FIG. 1, for illustrating a configuration of the pod, a door, and the gas purge device according to the embodiment of the present invention.
Figure 3:
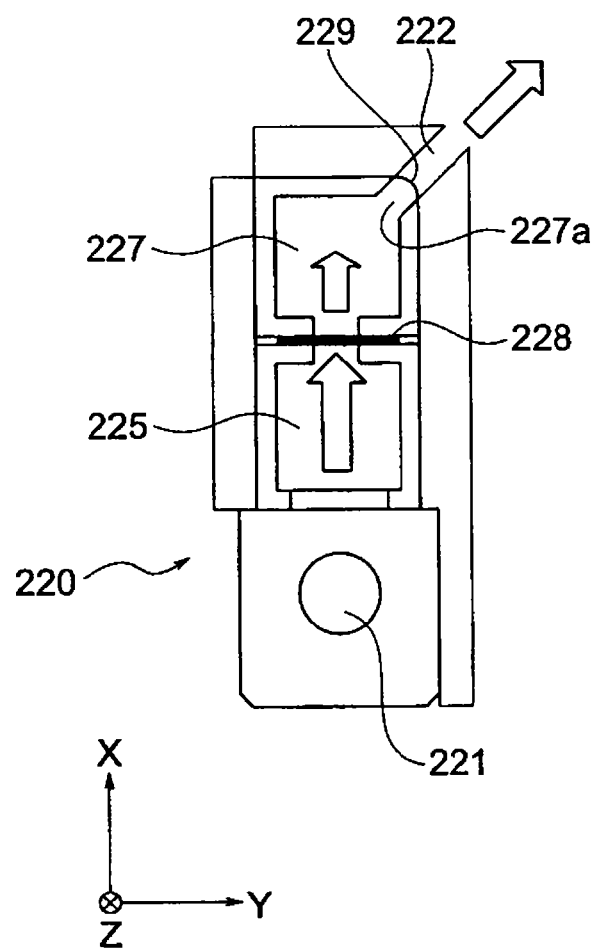
FIG. 3 is an enlarged view for illustrating a gas purge nozzle of FIG. 2 according to the embodiment of the present invention in a similar manner to that of FIG. 2.
Figure 4:
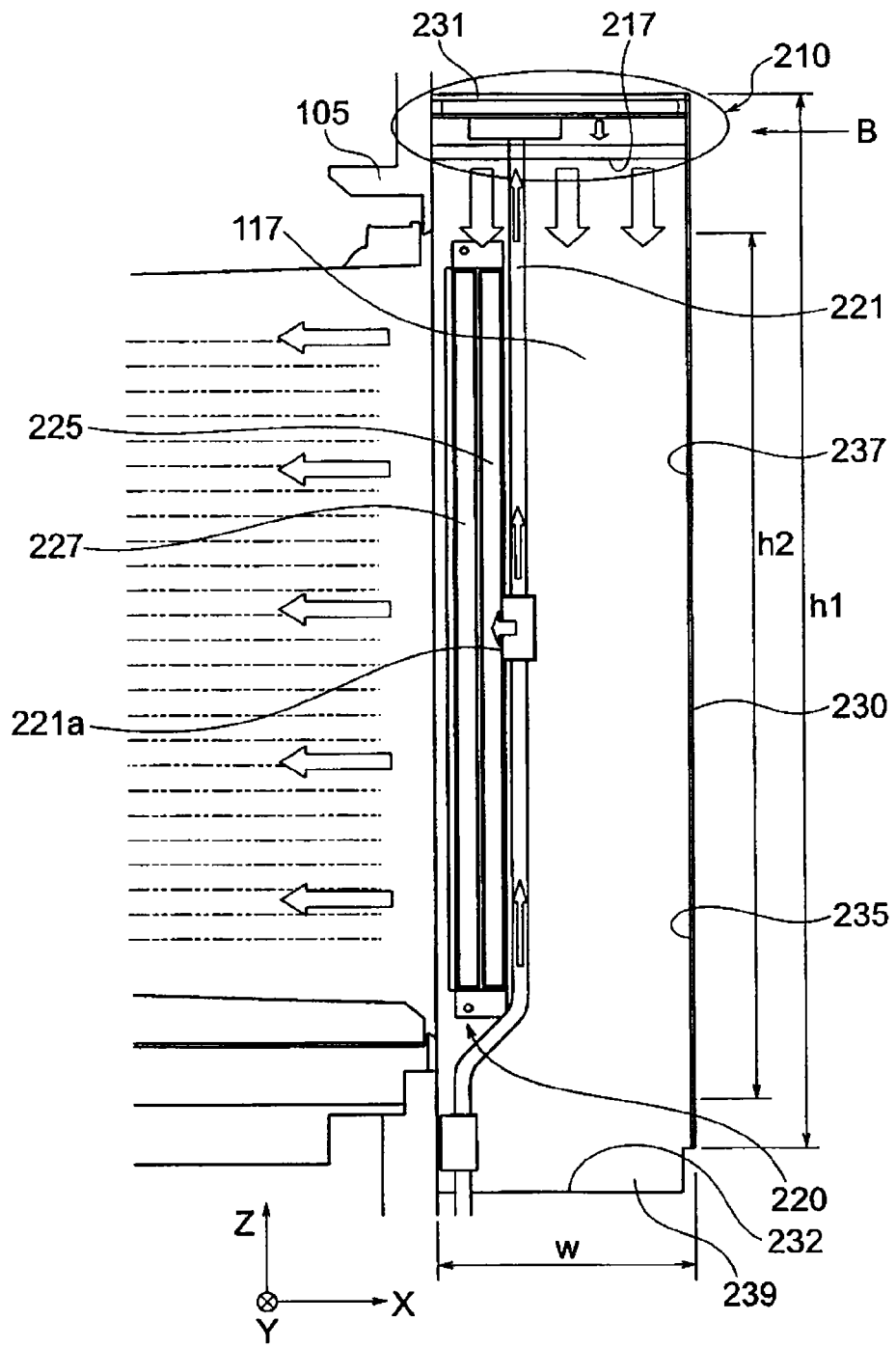
FIG. 4 is a partial sectional view for illustrating a schematic configuration of the gas purge device of FIG. 2 according to the embodiment of the present invention, as seen from the same direction as in FIG. 1.
Figure 5:
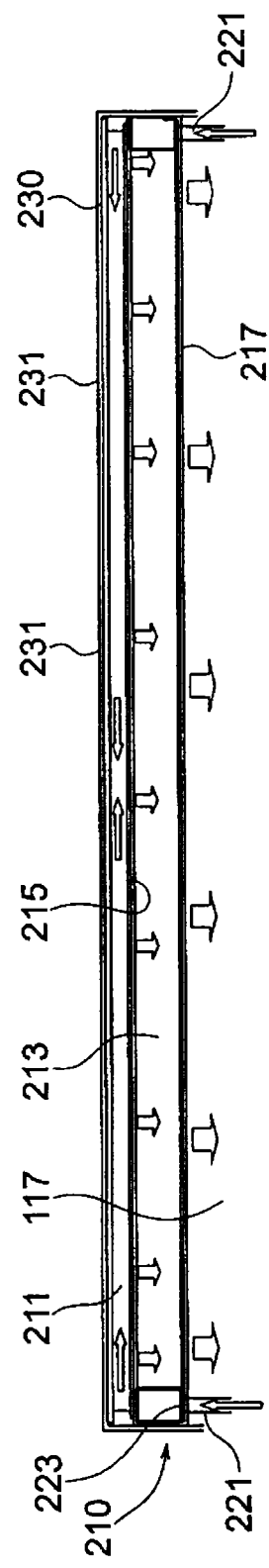
FIG. 5 is a partial sectional view for illustrating a schematic configuration of a curtain nozzle of FIG. 4, as seen from the arrow B direction of FIG. 4.

Exemplary embodiments of the present invention are described below with reference to the attached drawings. FIG. 1 is a side view for illustrating a schematic configuration of a load port apparatus according to an embodiment of the present invention, in which a pod 1 is mounted on a mount table. FIG. 2 is a top view taken along the line II-II of FIG. 1, for illustrating the schematic configuration of the load port apparatus in which a door described later holds a lid of the pod 1. FIG. 3 is an enlarged view for illustrating a purge nozzle of FIG. 2. FIG. 4 is a partial sectional view for illustrating a schematic configuration of a purge device according to this embodiment, as seen from the same direction as in FIG. 1. FIG. 5 is a partial sectional view for illustrating a schematic configuration of a curtain nozzle of FIG. 4, as seen from the arrow B direction of FIG. 4.

For the description of this embodiment, the pod for containing wafers is described first. The pod 1 of FIG. 1 includes a pod main body 2 and a lid 3. The pod main body 2 is formed into a substantially cubic shape, and has a containing space 2b therein, for containing wafers or the like. Further, the pod main body 2 has an opening 2a in one side plane of the cubic shape, and the opening communicates to the containing space 2b. In the one side plane, there is further formed a lid housing space 2c that communicates to the opening 2a so as to house the lid 3 therein. In the containing space 2b, multiple shelves (not shown) project from its side walls or the like so as to horizontally support the wafers (indicated by the two-dot chain lines of FIG. 1). The shelves hold multiple wafers in the containing space 2b horizontally at regular intervals.

A configuration of the load port apparatus according to this embodiment, to which the purge device is to be installed, is described below. A load port apparatus 101 includes a side base 105 that defines a mini-environment 103 separated from an external space 104, and a pod mount portion 121 arranged adjacent to the side base 105. The side base 105 includes a first opening portion 111 and a door system 115. In an upper portion of the mini-environment 103 defined by the side base 105 or the like, a fan (not shown) is arranged. The fan introduces, into the mini-environment, a gas which is present in the external space outside a casing of a semiconductor processing apparatus to which the load port apparatus is installed, and generates a so-called downflow in the mini-environment 103, which is a gas flow from an upper side toward a lower side of the mini-environment 103.

Note that, the fan is additionally provided with a filter for removing contaminants, such as dust, from the gas introduced from the external space in accordance with cleanliness of the external space. In a lower portion of the mini-environment 103, a structure that enables outflow of the downflow is arranged, and dust or the like generated in the mini-environment 103 is carried by the downflow and discharged from the lower portion of the mini-environment 103 to the external space. The first opening portion 111 appears to be closed by a door 115a of the door system 115, but a clearance is formed between an outer periphery of the door 115a and an inner peripheral surface of the first opening portion 111, and hence there is herein described that the door 115a is capable of substantially closing the first opening portion 111. The door 115a is capable of holding the lid 3, and performing operations of fixing and separating the lid 3 to and from the pod main body 2.

The pod mount portion 121 is capable of fixing the pod 1 mounted thereon, and bringing the pod 1 close to and apart from the above-mentioned first opening portion 111 (more precisely, the door 115a that closes the first opening portion 111). The pod mount portion 121 performs an operation of advancing the pod 1 until the pod 1 becomes close to the door 115a at a predetermined interval or the pod 1 abuts against the door 115a. Under a state in which the drive of the pod 1 is stopped, the door 115a holds the lid 3. Under this state, the door 115a separates the lid 3 from the pod main body 2, and further, moves downward from the first opening portion 111 by a door drive mechanism 115b so as to cause the opening 2a of the pod 1 to communicate to the mini-environment 103. Note that, in this embodiment, for convenience, a driving direction of the pod main body 2 is defined as "X-axis direction"; a direction that is orthogonal to the X-axis and defines an extending plane of each wafer together with the X-axis (direction perpendicular to the drawing sheet of FIG. 1), "Y-axis direction"; and a direction perpendicular to an XY plane defined by the X-axis and the Y-axis, "Z-axis direction". In this embodiment, the vertical direction corresponds to the Z-axis direction, and the upper side and the lower side herein correspond to the upper side and the lower side in the vertical direction, respectively. However, the extending direction of the Z-axis in the present invention is not limited to the vertical direction, and may be set with a shift from the vertical direction as necessary.

A gas purge device 200 according to this embodiment is used by being fixed to the load port apparatus described above. Hereinafter, the gas purge device is described in detail. The gas purge device 200 according to the present invention includes a curtain nozzle 210, a pair of purge nozzles 220, and a cover member 230. The cover member 230 includes an upper plate 231, a pair of side plates 233, and a chamber delimiting plate 235. The upper plate 231 is arranged on an outer side (upper side) of an upper edge of the first opening portion 111 at a predetermined interval so as to project by a predetermined width "w" from the side base 105 toward the mini-environment 103 (in the X-axis direction). The pair of side plates 233 is connected to the upper plate 231 at an upper end portion thereof, and extends in the vertical direction (Z-axis direction). Further, the pair of side plates 233 is fixed so as to project from the side base 105 toward the mini-environment 103. With this configuration, the cover member 230 is formed into an inverted U-shape that surrounds the first opening portion 111, has the projecting width "w", and opening on a lower side thereof. An upper edge of the cover member 230 formed into the inverted U-shape has a length "L1", and both side edges thereof have a length "h1". The opening of the cover member 230 formed into the inverted U-shape, which is formed on the lower side of the first opening portion 111, serves as a door opening portion 232 for ensuring an operation range of the door 115a when holding the lid and retracting toward the lower side of the first opening portion 111.

The chamber delimiting plate 235 is fixed to edges of the cover member 230 formed into the inverted U-shape, which are opposite to the side on which the cover member 230 is fixed to the side base 105, so as to be opposed to the side base 105 across the cover member 230 formed into the inverted U-shape. The chamber delimiting plate 235 includes a cover member opening portion 237 having a length "h2" in the vertical direction and a length "L2" in the horizontal direction. The cover member opening portion 237 is sized so that the wafers to be contained in the pod 1 are insertable and removable into/from the pod 1 therethrough, and that the cover member opening portion 237 is closable behind the door 115a. With the above-mentioned configuration, the cover member 230 forms a second mini-environment 117 arranged between the first opening portion 111 and the mini-environment 103, and separated from the mini-environment 103.

Note that, in this embodiment, the cover member 230 includes the cover member opening portion 237 and the door opening portion 232, and forms the second mini-environment 117 substantially delimited at five surfaces thereof. With this configuration, an adverse effect of the so-called downflow, which is generated in the mini-environment 103, on the second mini-environment 117 is to be suppressed to the extent possible. Note that, in a case where a sufficient amount of purge gas can be supplied from the curtain nozzle 210 described later, or in a case where a region which is sufficient in concentration of the inert gas can be formed at a position immediately in front of the first opening portion 111, the chamber delimiting plate 235 may be omitted or the projecting amount of the side plates 233 may be reduced, for example, so that the second mini-environment 117 is formed to have no distinct outer edges. Also in this case, in the present invention, the cover member 230 surrounds the first opening portion 111 to define the second mini-environment 117 as a partial space arranged in the mini-environment 103.

As illustrated in FIG. 4, the curtain nozzle 210 is arranged on an inner side of the upper plate 231 that defines the interior of the second mini-environment 117, and on an outer side of the first opening portion 111 (opening portion according to the present invention) so as to be situated in parallel to the upper edge of the first opening portion 111. Further, as illustrated in FIG. 5, the curtain nozzle 210 includes an upper first curtain chamber 211 and a lower second curtain chamber 213, which are arranged in an overlapping manner in the vertical direction. Note that, the first curtain chamber 211 functions as an internal space of the curtain nozzle according to the present invention. Gas supply pipes 221, which are arranged along the pair of purge nozzles 220 described later, are connected at their upper end portions to the first curtain chamber 211. Through the gas supply pipes 221, the purge gas is supplied.

A conductance adjusting unit 223 is arranged at each connection part between the first curtain chamber 211 and the gas supply pipe 221. The conductance adjusting unit 223 is capable of circulating the purge gas between the first curtain chamber 211 and the gas supply pipe 221, and is capable of generating a pressure difference between the first curtain chamber 211 and the gas supply pipe 221. In this embodiment, a so-called filter (223) is arranged as the conductance adjusting unit 223. The filter 223 is arranged in a flow passage of the purge gas to generate a pressure loss between an upstream side and a downstream side of the flow passage. Note that, in this configuration, the purge gas is guided to the internal space of the curtain nozzle 210 without being changed in its flow direction that is defined by each gas supply pipe 221.

A curtain chamber filter 215 is arranged between the first curtain chamber 211 and the second curtain chamber 213. The curtain chamber filter 215 is capable of diffusing a gas toward the second curtain chamber 213 at a position between the first curtain chamber 211 and the second curtain chamber 213, and is capable of generating a pressure difference between the first curtain chamber 211 and the second curtain chamber 213. That is, the curtain chamber filter 215 is arranged in a flow passage of the purge gas to generate a pressure loss between the first curtain chamber 211 on an upstream side of the flow passage and the second curtain chamber 213 on a downstream side of the flow passage. A curtain filter 217 is fixed to a lower surface of the second curtain chamber 213. Note that, in this embodiment, the lower surface of the second curtain chamber 213 has a shape and size conforming to those of the upper plate 231 of the cover member 230. Streams of the purge gas supplied from the pair of gas supply pipes 221 to both longitudinal end portions of the first curtain chamber 211 flow toward a longitudinal center portion as indicated by the arrows of FIG. 5. The purge gas filled in the first curtain chamber 211 flows into the second curtain chamber 213 through an intermediation of the curtain chamber filter 215. The curtain chamber filter 215 is capable of generating a pressure difference between the first curtain chamber 211 and the second curtain chamber 213, and the curtain chamber filter 215 reduces unevenness of a flow rate of the purge gas flowing into the second curtain chamber 213, which occurs depending on an inflow position of the purge gas.

The purge gas filled in the second curtain chamber 213 flows into the second mini-environment 117 through an intermediation of the curtain filter 217. The curtain filter 217 is capable of generating a pressure difference between the second curtain chamber 213 and the second mini-environment 117, and the curtain filter 217 reduces the unevenness of the flow rate of the purge gas flowing into the second mini-environment 117, which occurs depending on the inflow position of the purge gas. The purge gas flowing into the second mini-environment 117 has a downward vertical gas flow due to the pressure difference between the second curtain chamber 213 and the second mini-environment 117, and forms a gas flow in the second mini-environment 117 from the upper plate 231 toward an open lower plane 239 of the cover member 230. Note that, in this embodiment, the curtain filter 217 is fixed to the lower surface of the second curtain chamber 213 under a state in which the entire lower surface is opened, and the curtain filter 217 sets the entire lower surface of the second curtain chamber 213 as an outlet of the purge gas. Through the above-mentioned actions of the cover member 230 and the curtain nozzle 210, the interior of the second mini-environment 117 is maintained at a higher gas concentration as compared to the interior of the mini-environment 103, and as a result, a space which is low in oxygen concentration can be maintained.

Note that, in this embodiment, with use of the above-mentioned dual-chamber structure and multiple filters capable of generating a pressure difference, the purge gas is diffused, and the purge gas introduced into the second mini-environment 117 is uniformly discharged onto a plane through the entire region of the lower surface of the curtain nozzle 210. Note that, similar effects may be obtained even when the dual-chamber structure of this embodiment is, for example, a so-called dual-pipe structure in which gas jet holes provided in the individual pipes are not aligned. However, in a case of jetting the purge gas onto a plane, it is preferred to eliminate directivity of the gas flow and form the gas flow by the pressure difference. In this embodiment, the purge gas is discharged through an intermediation of the filters, and hence the effect of eliminating the directivity of the gas flow in part of the gas jetting surface can be obtained effectively at the entire lower surface of the curtain nozzle 210, with the result that the purge gas can easily be jetted onto a plane. In addition, multiple chambers are provided, and further, in an initial stage, the streams of the purge gases are supplied from both the longitudinal end portions in the first curtain chamber 211 so as to face each other. Thus, it is possible to more effectively suppress increase in gas jetting amount at a particular part.

Note that, in this embodiment, the above-mentioned configuration is provided assuming a case of supplying a large amount of purge gas. However, in a case where the effect of diffusing a sufficient purge gas can be obtained even when a small amount of purge gas is supplied through a hole, a single chamber may be provided or the curtain chamber filter 215 may be omitted, for example. Alternatively, the purge gas may be supplied from the curtain nozzle 210 to the second mini-environment 117 through an intermediation of the curtain filter 217 and a slit extending in an extending direction of the curtain nozzle or multiple juxtaposed holes instead of supplying the purge gas onto a plane. In this case, arrangement of the slit or the like, a distance between the first opening portion 111 and the slit or the like, or a relationship therebetween may be set arbitrarily.

Further, the filters described in this embodiment and the present invention, such as the curtain chamber filter 215, the curtain filter 217, the filter 223 used as the conductance adjusting unit, and a purge nozzle chamber filter 228 and a second purge nozzle filter 229 described later, are each formed of a member called "gas filter" to be used for removing fine particles in the gas. The gas filter has a function of generating a pressure difference between an upstream side and a downstream side of a gas flow passage in which the gas filter is arranged, and decreasing the directivity of the gas flow from the upstream side toward the downstream side, to thereby change the directivity of the gas discharged from the downstream side of the gas filter so that the gas is diffused. That is, the gas filter refers to a configuration capable of achieving both reduction in flow velocity of the purge gas passing through the gas filter, and diffusion of the purge gas.

Note that, the curtain chamber filter 215 is a so-called coarse filter that is easier in passage of a gas therethrough than the curtain filter 217, and is set so that a passage range of the purge gas becomes narrower. Further, the curtain chamber filter 215 is thinner than the curtain filter 217. That is, the curtain chamber filter 215 is smaller in degree of the pressure loss, whereas the curtain filter 217 is larger in degree of the pressure loss. With this configuration, the gas is introduced more easily from the gas supply pipes 221 to the first curtain chamber 211, and the flow velocity and the flow rate of the purge gas discharged from the curtain nozzle 210 for generating a gas curtain are set uniform in the entire region of the curtain nozzle 210. With the above-mentioned configuration, it is possible to discharge the purge gas onto a plane, and to generate a gas curtain which is high in purge gas concentration and reduced in oxygen concentration in a predetermined range from the first opening portion 111.

Next, the purge nozzle 220 is described. The purge nozzle 220 includes a first purge nozzle chamber 225 and a second purge nozzle chamber 227 each extending in the vertical direction parallel to both side edges of the first opening portion 111, and is fixed to the side plate 233 on an inner side of the cover member 230. For the purpose of reducing the number of components provided in the second mini-environment 117, in this embodiment, the gas supply pipe 221 is integrated with the purge nozzle 220. The first purge nozzle chamber 225 and the second purge nozzle chamber 227 are formed so that longitudinal lengths thereof are substantially equal to that of the opening portion of the pod main body 2. The purge gas is supplied from the gas supply pipe 221 to the first purge nozzle chamber 225 (purge nozzle 220) via a communication passage 221a provided in a direction different from an extending direction of the gas supply pipe 221 (in this embodiment, direction orthogonal to the extending direction of the gas supply pipe 221), for causing the gas supply pipe 221 and the first purge nozzle chamber 225 (purge nozzle 220) to communicate to each other. The purge nozzle chamber filter 228 is arranged between the first purge nozzle chamber 225 and the second purge nozzle chamber 227.

The purge nozzle chamber filter 228 is capable of supplying the purge gas from the first purge nozzle chamber 225 to the second purge nozzle chamber 227 while generating a pressure difference between the first purge nozzle chamber 225 and the second purge nozzle chamber 227. In this embodiment, the purge gas is supplied from the gas supply pipe 221 to the first purge nozzle chamber 225 through the single communication passage 221a. In this case, the purge nozzle chamber filter 228 suppresses direct flow of the purge gas from the communication passage 221a to the second purge nozzle chamber 227, to thereby ensure uniform traveling periods of the purge gas in the first purge nozzle chamber 225. With this configuration, the purge gas is supplied from the purge nozzle chamber filter 228 to the second purge nozzle chamber 227 in a pressure distribution which is substantially uniform in the longitudinal direction.

The second purge nozzle chamber 227 includes a slit 227a for jetting a gas. The slit 227a has a length defined corresponding to the opening portion of the pod main body 2. Further, the slit 227a has an opening set so as to be oriented to an arbitrary position which is situated between the opening of the pod main body 2 and the center of each wafer contained in the pod 1 along a straight line passing through the center of the wafer and coincident with an advancing/retreating direction of the pod 1. The second purge nozzle filter 229 is arranged in the opening of the slit 227a. The second purge nozzle filter 229 is also capable of generating a pressure difference between the interior of the second purge nozzle chamber 227 and the external space. The second purge nozzle filter 229 ensures uniformity of the flow rate in an extending direction of the purge gas supplied from the slit 227a to the external space, that is, in the vertical direction.

Note that, the purge nozzle chamber filter 228 is a so-called coarse filter that is easier in passage of a gas therethrough than the second purge nozzle filter 229, and is set so that a passage range of the purge gas becomes narrower. Further, the purge nozzle chamber filter 228 is thinner than the second purge nozzle filter 229. That is, the purge nozzle chamber filter 228 is smaller in degree of the pressure loss, whereas the second purge nozzle filter 229 is larger in degree of the pressure loss. With this configuration, the gas is introduced more easily from the first purge nozzle chamber 225 to the second purge nozzle chamber 227, and the flow velocity and the flow rate of the purge gas discharged from the purge nozzle 220 for generating a gas flow to be used for purging the pod are set uniform in the entire region of the purge nozzle 220. With the above-mentioned configuration, it is possible to discharge the purge gas formed of the purge gas flow and having a certain width in a direction perpendicular to the flow direction, and to guide the purge gas flow into the pod without generating a region which is locally high in purge gas concentration and reduced in oxygen concentration.

The purge nozzle 220 further includes a flow control portion 222 arranged on an outer side of the second purge nozzle filter 229 corresponding to the opening of the slit 227a. The flow control portion 222 is formed into a slit shape having the same width as the slit 227a and provided in the same direction as that of the above-mentioned opening of the slit 227a. The purge gas flowing out of the purge nozzle 220 through an intermediation of the second purge nozzle filter 229 merely has a rough directivity. However, when the flow control portion 222 is arranged, the directivity is imparted to the purge gas flow, with the result that the purge gas can be supplied toward a predetermined position in the pod main body 2. Note that, in this embodiment, the flow control portion 222 is formed in a member that integrates the first purge nozzle chamber 225 and the second purge nozzle chamber 227, and is formed into a shape obtained by simply extending the shape of the opening of the slit 227a. Alternatively, for example, a baffle plate may be added as the flow control portion 222. Still alternatively, the flow control portion 222 may be formed into a shape in which the width thereof is decreased toward the opening so as to suppress the diffusion of the purge gas supplied from the second purge nozzle filter 229, or a shape in which the width thereof is increased conversely.

Note that, the first purge nozzle chamber 225 and the second purge nozzle chamber 227 are preferred to be formed in such a manner that outer shapes of the respective components having the purge nozzle chamber filter 228 interposed therebetween allow surface abutment in a region in which the purge nozzle chamber filter 228 is interposed. With this shape, the effect of the purge nozzle chamber filter 228 can be obtained uniformly in the entire region of the purge gas flow passage. Further, the purge nozzle chamber filter 228 is a so-called coarse filter that is easier in passage of a gas therethrough than the second purge nozzle filter 229, and is set so that a passage range of the purge gas becomes narrower. The purge nozzle chamber filter 228 is thinner than the second purge nozzle filter 229. With this configuration, the gas is introduced more easily from the gas supply pipe 221 to the first purge nozzle chamber 225, and the flow velocity and the flow rate of the purge gas discharged from the purge nozzle 220 for purging are set uniform in the entire region of the purge nozzle 220.

Note that, this embodiment employs a configuration in which the slit 227a is opened at a corner portion of the second purge nozzle chamber 227 having a rectangular shape in cross section. With this configuration, the length of the slit 227a can be increased, with the result that the function of the flow control portion 222 can be imparted to the slit 227a to some extent. In addition, an action region of the flow control portion 222 itself can be set longer. Further, the second purge nozzle filter 229 can be used by being curved along the corner so that dense and coarse parts of the gas flow passage are formed in the single filter. As a result, it is possible to obtain effects of diffusing the purge gas appropriately and suppressing unnecessary reduction in flow velocity of the purge gas.

Note that, in this embodiment, as described above, the gas is supplied from the gas supply pipe 221 to the first purge nozzle chamber 225 via the communication passage 221a formed merely of a hole or slit, and the gas is supplied to the first curtain chamber 211 through an intermediation of the conductance adjusting unit 223. In general, the gas is easily supplied to a chamber arranged in a direction corresponding to the flow direction of the gas, but is not easily supplied to a chamber arranged via a flow passage orthogonal to the flow direction. In the present invention, the conductance adjusting unit 223 is arranged in the flow passage leading to the first curtain chamber 211 as the chamber in the former case, with the result that the supply amount of the gas in the direction along the flow direction is reduced and the supply amount of the gas in the direction orthogonal to the flow direction is increased. With the gas purge device having the configuration described above, it is possible to easily perform the following operations in parallel by using the single gas supply line: for example, formation of the so-called gas curtain formed of the inert gas such as nitrogen; and purging of the pod through supply of the inert gas into the pod.

Note that, in the embodiment described above, the curtain nozzle 210 and the purge nozzle 220 both have the dual-chamber structure. However, the present invention is not limited thereto, and the number of chambers may be increased or a single-chamber structure may be provided depending on the supply amount and supply pressure of the purge gas. In any case, when the purge gas discharged from the nozzle is caused to pass through a filter arranged in the final stage, it is possible to suitably diffuse the purge gas and to reduce the flow velocity thereof. Further, in the configuration of the present invention, in which the purge gas is supplied from a single gas supply source, the conductance adjusting unit formed of a filter or the like is arranged in the opening of the gas supply pipe on the curtain nozzle side, on which the gas easily flows in. Thus, it is possible to increase the supply amount of the purge gas to the purge nozzle side which is inferior in easiness of gas inflow, and to reduce the supply amount of the purge gas to the curtain nozzle side. Accordingly, even in the case of using a single purge gas supply source, both the generation of an appropriate gas curtain and the supply of a sufficient purge gas can be achieved.

Figure 6:
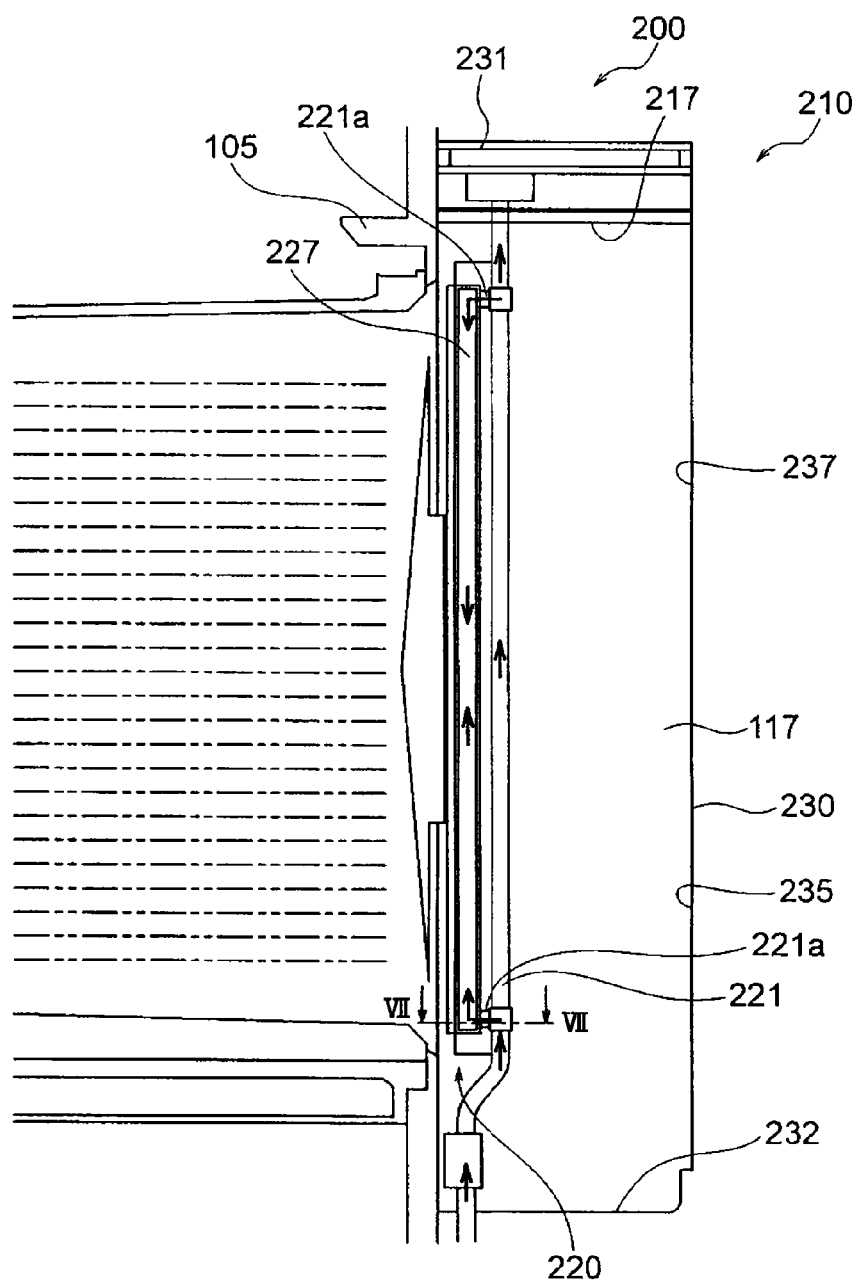
FIG. 6 is a partial sectional view for illustrating a schematic configuration of a gas purge device according to a further embodiment of the present invention in a similar manner to that of FIG. 4.
Figure 7:
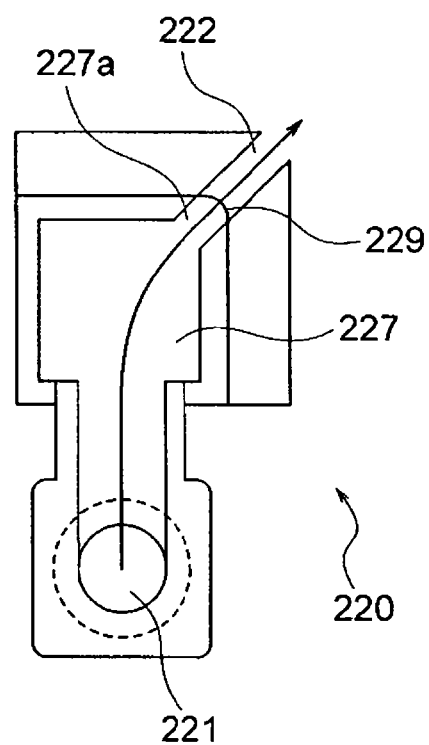
FIG. 7 is a view taken along the arrow VII-VII of FIG. 6 according to the further embodiment of the present invention.

Next, a further embodiment of the present invention is described. Note that, the same components as those in the above-mentioned embodiment illustrated in FIG. 4 and the like are represented by the same reference symbols, and description thereof is therefore omitted herein. Hereinafter, a purge nozzle 220 which is different from that in the above-mentioned embodiment is described in detail. FIG. 6 is a view for illustrating a gas purge device 200 according to this embodiment in a layout similar to that of FIG. 4. FIG. 7 is a view of the gas purge device 200 illustrated in FIG. 6, which is taken along the arrow VII-VII of FIG. 6. The purge nozzle 220 according to this embodiment is different from the purge nozzle 220 according to the above-mentioned embodiment in that the first purge nozzle chamber 225 and the purge nozzle chamber filter 228 are omitted. That is, the purge nozzle 220 includes the gas supply pipe 221, the second purge nozzle chamber 227, and the second purge nozzle filter 229. Further, in order to supply the purge gas from the gas supply pipe 221 to the second purge nozzle chamber 227, the communication passages 221a are provided in the vicinity of both end portions in an extending direction of the second purge nozzle chamber 227. Effects obtained from the components of the purge nozzle 220 are the same as those obtained from the same components in the above-mentioned embodiment.

The communication passages 221a are arranged at two positions on an upstream side and a downstream side in the flow direction of the purge gas. The flow of the purge gas in the gas supply pipe 221 is blocked by the conductance adjusting unit, with the result that the majority of the purge gas temporarily flows toward the second purge nozzle chamber 227 via the communication passages 221a. The communication passage 221a on the upstream side is arranged in advance at a position in a range from a predetermined position on the upstream side of the gas supply pipe 221 to a predetermined position on the second purge nozzle chamber 227 in the vicinity thereof, and the communication passage 221a on the downstream side is further arranged in advance in the vicinity of the conductance adjusting unit. Thus, the purge gas is supplied to the second purge nozzle chamber 227 from both the upstream position and the downstream position of the gas supply pipe 221. With this configuration, the purge gas can be supplied uniformly in the extending direction of the purge nozzle 220 even in the configuration in which the first purge nozzle chamber 225 in the above-mentioned embodiment is omitted.

Note that, as in the embodiment exemplified above, in a case where the communication passages 221a leading to the second purge nozzle chamber 227 are arranged at least at two positions on the upstream side and the downstream side of the gas supply pipe 221 in terms of the supply flow of the purge gas, the respective communication passages 221a are preferred to be arranged at positions equally spaced from the center of the second purge nozzle chamber 227 in the extending direction thereof. With this configuration, the pressure of the purge gas in the second purge nozzle chamber 227 can be set uniform rapidly. Further, depending on the flow rate of the purge gas to be supplied, the communication passage 221a on the downstream side is preferred to be provided at a position proximate to the downstream side of the gas supply pipe 221 in the extending direction of the second purge nozzle chamber 227. Note that, in this case, the communication passage 221a on the upstream side is preferred to be provided at a corresponding position on the upstream side of the gas supply pipe 221 with respect to the center of the second purge nozzle chamber 227 in the extending direction thereof. When the communication passages 221a are provided at the above-mentioned positions, the purge gas in the gas supply pipe 221 temporarily blocked by the conductance adjusting unit reaches the second purge nozzle chamber 227 from the block position via the communication passage 221a on the downstream side, with the result that response of the purge gas supply is enhanced.

Thus, from the viewpoint described above, in a case of providing the pair of communication passages 221a, as illustrated in FIG. 6, the communication passages 221a are arranged in the vicinity of both the end portions in the extending direction of the second purge nozzle chamber 227. Accordingly, the above-mentioned conditions are satisfied, and the purge gas can be supplied suitably. Note that, in the embodiment described above, there has been described a case where the communication passages 221a are arranged at two positions, but the number of the communication passages 221a may be increased. In this case, the communication passages 221a are arranged at two positions at the ends of the upstream side and the downstream side of the gas supply pipe 221, while satisfying the above-mentioned conditions. Accordingly, the purge gas can be supplied into the second purge nozzle chamber 227 rapidly and uniformly. Further, in this embodiment, there has been exemplified a configuration in which only the second purge nozzle chamber 227 and the second purge nozzle filter 229 are provided, but at least one of the first purge nozzle chamber 225 and the purge nozzle chamber filter 228 described above may be added thereto, with the result that the purge gas supplied from the entire region of the purge nozzle 220 can be diffused uniformly.

As described hereinabove, the present invention relates to a gas purge device to be used for a load port apparatus, which is used suitably for semiconductor processing apparatus, the gas purge device being configured to reduce an oxidizing gas in a so-called pod. However, the present invention is applicable not only to the semiconductor processing apparatus but also to so-called load port apparatus used for various processing apparatus in which various processes conforming to those for semiconductors are performed, such as processing apparatus which handle panels for liquid crystal displays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-177499, filed Aug. 15, 2011 and 2012-133871, filed Jun. 13, 2012, which are hereby incorporated by reference herein in their entirety.

What is claimed is:

1. A gas purge device to be used for a load port apparatus, the load port apparatus comprising:
    a side base that defines a first mini-environment; and
    a door capable of closing an opening portion of the side base,
    the door being configured to hold a lid of a sealed container for containing an object to be contained, and to open and close the lid of the sealed container so that the object to be contained is insertable and removable into/from the sealed container,
    the gas purge device comprising:
    a cover member arranged in the first mini-environment in surrounding the opening portion, the cover member defining a second mini-environment in the first mini-environment;
    a curtain nozzle arranged inside of the second mini-environment at a position above the opening portion, for supplying a purge gas into the second mini-environment;
    a pair of purge nozzles arranged inside of the second mini-environment at both side portions of the opening portion so as to be capable of supplying the purge gas into the sealed container via the opening portion;
    a gas supply pipe extending toward the curtain nozzle, for supplying the purge gas to each of the pair of purge nozzles from a different direction from the extending direction of the gas supply pipe, and for supplying the purge gas to an internal space of the curtain nozzle by being connected to the internal space of the curtain nozzle at an end portion in the extending direction of the gas supply pipe; and
    a conductance adjusting unit arranged at the end portion of the gas supply pipe connected to the internal space of the curtain nozzle, for adjusting conductance at the end portion at the time of supplying the purge gas to the internal space of the curtain nozzle.

2. A gas purge device according to claim 1,
    wherein the cover member comprises a cover member opening portion that enables an operation of inserting and removing the object to be contained,
    wherein the curtain nozzle supplies the purge gas, with respect to the second mini-environment defined between the opening portion and the cover member, onto a plane formed by intersecting the opening portion and the cover member, and
    wherein the each of the pair of purge nozzles extends along a side edge of the opening portion in parallel to the gas supply pipe.

3. A gas purge device according to claim 1,
    wherein the curtain nozzle comprises a curtain filter, and the purge gas is supplied through an intermediation of the curtain filter, and
    wherein the each of the pair of purge nozzles comprises a purge nozzle filter, and the purge gas is supplied into the sealed container through an intermediation of the purge nozzle filter.

4. A gas purge device according to claim 1,
    wherein the curtain nozzle comprises:
    a first curtain chamber and a second curtain chamber arranged in a purge gas supplying order, the first curtain chamber and the second curtain chamber serving as the internal space of the curtain nozzle; and a curtain chamber filter arranged between the first curtain chamber and the second curtain chamber, the curtain chamber filter being capable of generating a pressure difference between the first curtain chamber and the second curtain chamber, and wherein the purge gas is supplied from the first curtain chamber to the second curtain chamber through an intermediation of the curtain chamber filter.

5. A gas purge device according to claim 1, wherein the each of the pair of purge nozzles comprises:

a first purge nozzle chamber and a second purge nozzle chamber arranged in a purge gas supplying order; and a purge nozzle chamber filter arranged between the first purge nozzle chamber and the second purge nozzle chamber, the purge nozzle chamber filter being capable of generating a pressure difference between the first purge nozzle chamber and the second purge nozzle chamber, and wherein the purge gas is supplied from the first purge nozzle chamber to the second purge nozzle chamber through an intermediation of the purge nozzle chamber filter.

6. A gas purge device according to claim 3, wherein the curtain nozzle comprises:

a first curtain chamber and a second curtain chamber arranged in a purge gas supplying order, the first curtain chamber and the second curtain chamber serving as the internal space of the curtain nozzle; and a curtain chamber filter arranged between the first curtain chamber and the second curtain chamber, the curtain chamber filter being capable of generating a pressure difference between the first curtain chamber and the second curtain chamber, wherein the purge gas is supplied from the first curtain chamber to the second curtain chamber through an intermediation of the curtain chamber filter, wherein the each of the pair of purge nozzles comprises:

a first purge nozzle chamber and a second purge nozzle chamber arranged in a purge gas supplying order; and a purge nozzle chamber filter arranged between the first purge nozzle chamber and the second purge nozzle chamber, the purge nozzle chamber filter being capable of generating a pressure difference between the first purge nozzle chamber and the second purge nozzle chamber, wherein the purge gas is supplied from the first purge nozzle chamber to the second purge nozzle chamber through an intermediation of the purge nozzle chamber filter, and wherein at least one of a set of the curtain filter and the curtain chamber filter and a set of the purge nozzle filter and the purge nozzle chamber filter has a difference in degree of pressure loss.

7. A gas purge device according to claim 1, wherein the each of the pair of purge nozzles comprises a purge nozzle chamber capable of generating a pressure difference between the purge nozzle chamber and the second mini-environment through an intermediation of a purge nozzle filter, and wherein the purge gas is supplied from the gas supply pipe to the purge nozzle chamber via communication passages arranged at least at two positions on an upstream side and a downstream side in a case of supplying the purge gas to the gas supply pipe.

8. A gas purge device according to claim 1, wherein the each of the pair of purge nozzles comprises a flow control portion that defines a discharge direction of the purge gas at the time of discharging the purge gas.

9. A load port apparatus, comprising:

a side base that defines a mini-environment;

a door capable of closing an opening portion of the side base, the door being configured to hold a lid of a sealed container for containing an object to be contained, and to open and close the lid of the sealed container so that the object to be contained is insertable and removable into/from the sealed container;

a door drive mechanism for supporting the side base, and the door, and for causing the door to open and close the opening portion;

a mount base arranged on an outer side of the opening portion, on which the sealed container is mountable, the mount base being configured to align the sealed container and the opening portion with each other; and the gas purge device according to claim 1.

* * * * *